United States Patent [19]

Rice et al.

[11] Patent Number: 4,767,003
[45] Date of Patent: Aug. 30, 1988

[54] TRANSPARENT, ELECTROSTATIC PROTECTIVE CONTAINER WITH READILY ACCESSIBLE IDENTIFICATION MEANS

[75] Inventors: Allyn B. Rice, Fullerton; Ronald L. Johnson, Placentia; Milton J. Peterman, Los Angeles, all of Calif.

[73] Assignee: Hughes Aircraft Company, Los Angeles, Calif.

[21] Appl. No.: 51,223

[22] Filed: May 7, 1987

Related U.S. Application Data

[63] Continuation of Ser. No. 788,896, Oct. 18, 1985, abandoned.

[51] Int. Cl.$^4$ .............................................. B65D 73/02
[52] U.S. Cl. ............................. 206/328; 206/45.31; 206/232; 206/334; 206/499; 206/508; 206/509; 206/523; 206/593; 206/45.34; 220/342
[58] Field of Search ............... 206/45.13, 45.31, 45.34, 206/232, 328, 329, 332, 334, 449, 450, 459, 470–475, 499, 508, 509, 523, 585, 593, 594; 220/337, 339, 341, 342, 343

[56] References Cited

U.S. PATENT DOCUMENTS

| | | | |
|---|---|---|---|
| 2,196,740 | 4/1940 | Ross | 220/342 |
| 2,546,590 | 3/1951 | Ferrel | 220/342 |
| 3,088,584 | 5/1963 | Kozikowski | 206/473 |
| 3,256,975 | 11/1963 | Puente | 206/46 |
| 3,550,769 | 12/1970 | Wolk | 206/45.34 |
| 3,628,215 | 12/1971 | Everburg | 220/337 |
| 3,645,281 | 2/1972 | Seidler | 206/45.34 |
| 3,822,781 | 7/1974 | Braginetz | 206/45.34 |
| 3,842,974 | 10/1974 | Jacobsen | 206/45.34 |
| 4,139,097 | 2/1979 | Bowman et al. | 206/449 |
| 4,160,503 | 7/1979 | Ohlbach | 206/328 |
| 4,200,191 | 4/1980 | Nakamura et al. | 206/328 |
| 4,211,324 | 7/1980 | Ohlbach | 206/328 |
| 4,241,829 | 12/1980 | Hardy | 206/328 |
| 4,293,070 | 10/1981 | Ohlbach | 206/328 |
| 4,308,953 | 1/1982 | Cohen | 206/334 |
| 4,327,832 | 5/1982 | de Matteo | 206/334 |
| 4,341,307 | 7/1982 | Shyers | 220/339 |
| 4,366,915 | 1/1983 | Seidler | 220/339 |
| 4,407,410 | 10/1983 | Graetz et al. | 220/339 |
| 4,427,114 | 1/1984 | Howell et al. | |
| 4,431,114 | 2/1984 | Kleinfeld | 206/45.34 |
| 4,446,966 | 5/1984 | Moloney | 206/334 |
| 4,480,747 | 11/1984 | Kazor et al. | 206/334 |
| 4,487,328 | 12/1984 | Wilcox et al. | 220/334 |
| 4,494,651 | 1/1985 | Malcolm | 206/328 |
| 4,565,288 | 1/1986 | Walther | 206/334 |
| 4,585,121 | 4/1986 | Capelle, Jr. | 206/334 |

FOREIGN PATENT DOCUMENTS 2421001 2/1975 Fed. Rep. of Germany ... 206/45.34

OTHER PUBLICATIONS

Egan et al., Western Electric Technical Digest, No. 30, Apr. 1973, pp. 7, 8, "Integrated Circuit Shipping Package".

Capousis et al, IBM Technical Disclosure Bulletin, vol. 17, No. 10, Mar. 1975, "Protective Container for Integrated Circuit Modules".

Wanesky, Western Electric Technical Digest, No. 15, (List continued on next page.)

Primary Examiner—David T. Fidei
Attorney, Agent, or Firm—Thomas A. Runk; Anthony W. Karambelas

[57] ABSTRACT

A protective container is disclosed which includes an integral pocket for holding identification material relating to the contents of the container. The pocket and an associated tab over the pocket opening position the identification material such that bar code graphs or magnetic media mounted thereon can be easily read and accessed without requiring that the container be opened or removed from a stack of containers. In the disclosed embodiment, static protective foam liners are used to support the contents as well as provide an electrical path for any charge accumulated on the contents. The container is formed of an optically transparent material which is also static protective in nature. A viewing means is provided in the container and internal support means so that the presence or absence of any contents can be rapidly determined without opening the container.

28 Claims, 4 Drawing Sheets

OTHER PUBLICATIONS

Jul. 1969, p. 19, "Package for Transporting Beam-Lead Devices on a Substrate".
International Search Report PCT/US 86/01936, PD 84143P.
IBM Technical Disclosure Bulletin, vol. 23, No. 7A, Dec. 1980, "Equipment Trays for Handling Ceramic Greensheets".
IBM Technical Disclosure Bulletin, vol. 26, No. 9, Feb. 1984, "Physical and Electrostatic Discharge Protection Package".

Fig. I.

Fig. 5
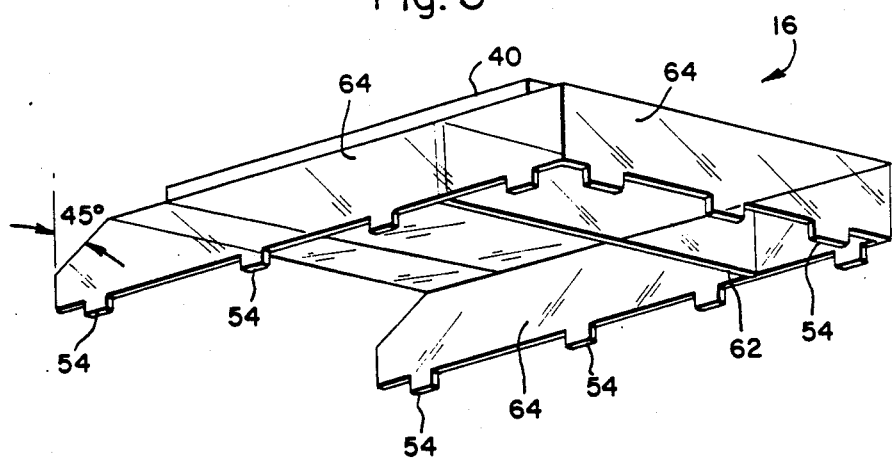
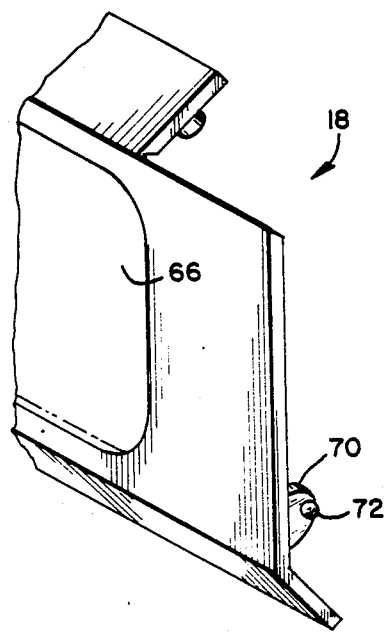
Fig. 6a.
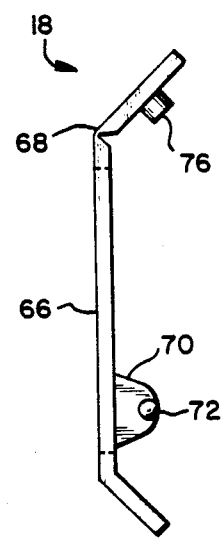
Fig. 6b

TRANSPARENT, ELECTROSTATIC PROTECTIVE CONTAINER WITH READILY ACCESSIBLE IDENTIFICATION MEANS

This application is a continuation of application Ser. No. 788,896, filed Oct. 18, 1985 now abandoned.

BACKGROUND OF THE INVENTION

The invention relates generally to containers for handling, transporting and storing electronic components and more particularly, to containers which protect the contents against damaging electrostatic discharges.

Electronic components are typically transported from place to place and stored in some type of shipping container specifically designed for protection. Due to the increase usage of electrostatic sensitive electronic components, many shipping containers have been designed to include an electrostatic protection means. Components such as Metal Oxide Semi-conductors (MOS), field effect transistor silicon chips, small cross-sectional area semi-conductor junctions, piezoelectric crystals, and other such devices are relatively sensitive to electrostatic discharges. Thus, when handling or storing such components, an electrostatic protection means is typically used.

Some electrostatic protection means use a continuous conductive enclosure about the component thereby establishing an equi-potential surface and preventing the accumulation of externally generated electric charge inside the enclosure. In some cases, a means for interconnecting any charge residing on the enclosure with a dissipation means is used. An example is the carbon impregnated plastic bag. Such bags are used to surround the protected component and result in a conductive enclosure about the component. Electrostatic charge built up on the bag is dissipated by connecting the bag to a suitable ground or by bleeding it off into the atmosphere. However, these plastic bags are not rigid enough to provide a structure which will support stacking many such enclosed components on top of one another. Another enclosure is used in which the plastic bag is placed. Another consideration with this technique is the difficulty in performing inventory control. The identification material and other documents associated with the contents of the bag are usually placed in a separate pouch which is placed in the bottom of the container and must be removed by hand to inspect.

Other precautions used to protect sensitive electronic components include enclosing the sensitive component in a "bubble-wrap" which is partially electrically conductive, the use of temporary shorting devices during shipping and storage, the use of built-in protection devices such as zener diodes, and other techniques. While the above techniques are generally useful, in some cases further protection is ncessary.

A technique which provides further protection comprises a box-like, rigid, container which is coated with an anti-static material. One embodiment is the use of a clear plastic which is treated with a topical anti-static film. The sensitive component is secured inside the box and the box is closed thus forming a partially electrically conductive enclosure about the component. A conductor of some type may be connected to the box to provide a path to ground potential. The box thus forms an equi-potential surface to protect the contents from external electrostatic influences. In some cases, a partially electrically conductive, pliable, elastomeric, plastic foam is used inside the container to secure the sensitive component in position. The foam provides an electrical path from the sensitive component to the outer enclosure. Thus, charges accumulating on the sensitive component will be conducted away to the equi-potential surface and will be conducted to ground. Since they are rigid, these containers permit storage by stacking. However, it has been found that many anti-static coating materials are not always reliable for dissipating large charges. It has also been found that some liquids used to treat the plastic wear off. Thus the container must be tested routinely or discarded after a certain time. Also, this prior technique has been relatively expensive.

A technique found to be superior to the foregoing is the use of a partially electrically conductive plastic material molded into a box-like shape to hold the sensitive component. The plastic material forms the equi-potential surface around the component protecting it from external electrostatic influences. Such containers are rigid enough to be stacked and to protect the enclosed component from physical shocks. As in other techniques, a partially electrically conductive, elastomeric, plastic foam is used inside the container to secure the contents.

However, none of the above techniques have combined in one container features for protecting sensitive electronic components from electrostatic discharges during handling, transporting, and storing, while providing a container adapted for efficient inventory control. In many prior techniques, the accompanying documents are placed inside the container with the sensitive component. To review the documents, the container must be opened which breaks the protective surface surrounding the component and subjects it to possible electrostatic discharges due to this handling. A container that is static protective, presents certain information about its contents and allows access to accompanying documents without requiring that the container be opened, and which is easily inspected to assure that contents exist would be a valuable addition to the art.

SUMMARY OF THE INVENTION

In accordance with the invention, there is provided a container usable for the shipping, handling, and transportation of sensitive electronic components comprising, in the preferred embodiment, a pair of open-ended containers which are joined together at their open ends to form a closed container. The container is formed of an optically transparent, static protective plastic material for viewing at least part of the contents. The container includes a means such as static protective, elastomeric, plastic foam for securing the electronic component in a selected position. The foam is both in contact with the static protective container and the contents. The means may be shaped in order to support the contents in a particular way and may, with or without foam, include protrusions from the inside of the container to engage and position the electronic component in a particular manner. The means further include an aperture so that the presence of contents may be ascertained by viewing from the outside of the optically transparent container thus obviating any need to disassemble or open the container for this purpose.

Another feature of a container in accordance with the invention is an integral pocket to hold accompanying documents. The pocket is constructed so that it is accessible when the container is stacked or otherwise disposed in a way that makes it difficult to open. The pocket includes a hinged tab having a window through which the documents, such as identification material, placed in the pocket may be viewed or read. Identification material such as a bar code graph or a magnetic medium are inserted in the pocket and held in place by the tab. The window in the tab allows reading of the bar code graph or magnetic medium without moving the container from the stack and without opening the container, which would involve breaking the equi-potential surface around the electronic component. In one embodiment, a tab over the pocket having a 45 degree angle is used. This particular tilt enables viewing of the window when the container is in a vertical stack or a horizontal stack or in other arrangements.

BRIEF DESCRIPTION OF THE DRAWINGS

The various features and advantages of the invention together with further features, advantages and purposes thereof are described with more particularity in the following detailed description taken in conjunction with the accompanying drawings in which:

FIG. 5 presents an up-looking perspective view of the paperwork pocket structure showing the rear, paperwork retaining ridge;

FIGS. 6a and 6b present different views of a tab closure means in accordance with the invention showing the mounting tabs and the window through which the identification material may be read.

DETAILED DESCRIPTION OF THE INVENTION

Figure 1:
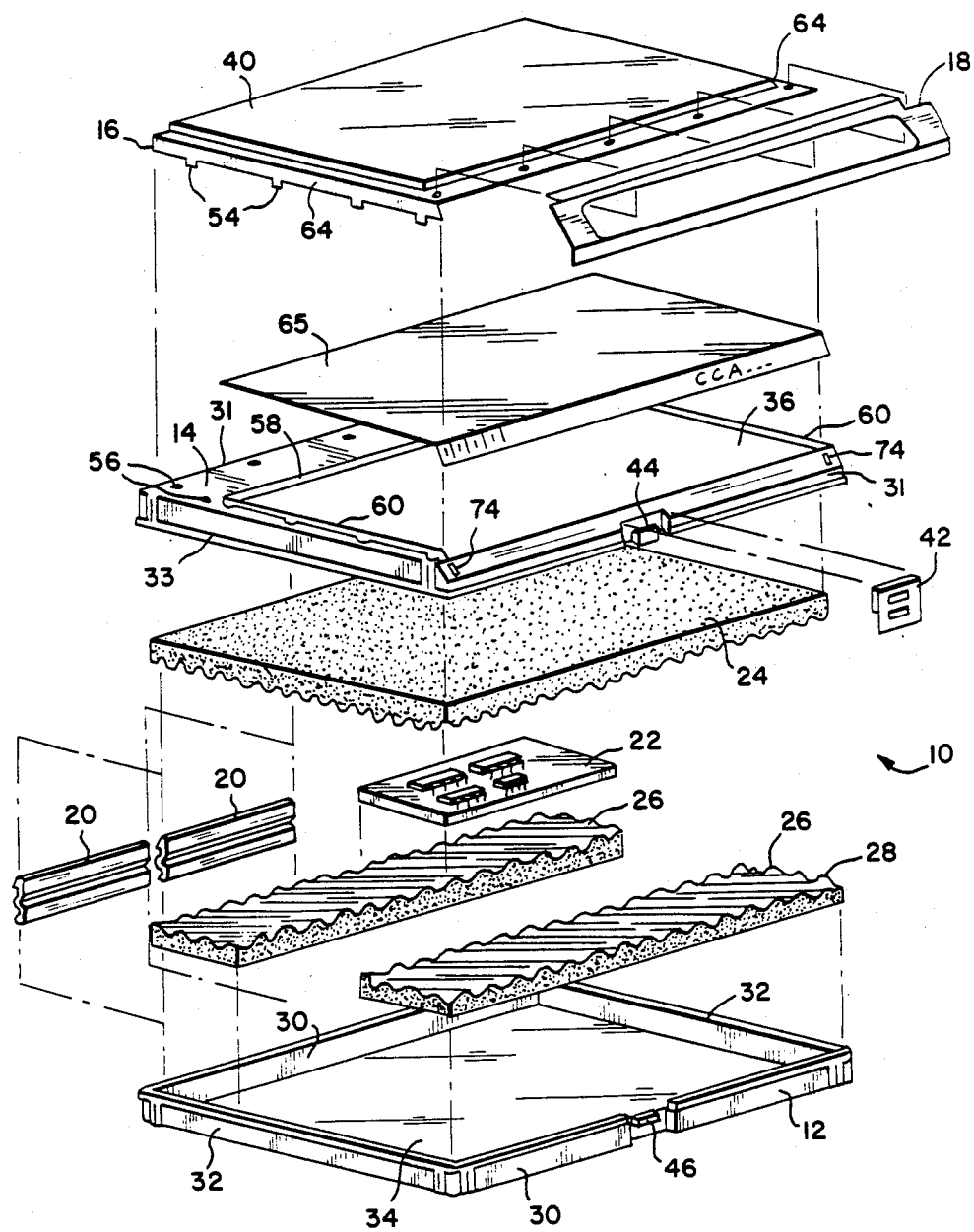
FIG. 1 is an exploded, perspective view of a protective container in accordance with the invention. Also shown is a circuit card containing certain electrostatic discharge sensitive devices, and a paper card containing a laser-readable bar code graph which identifies the circuit card.

Referring now to the drawings wherein like reference numerals designate like or corresponding elements among the several views, there is shown in FIG. 1 a container 10 in accordance with the invention having a bottom open container member 12, a top open container member 14, a third open container member 16 for forming a documents pocket, and a tab 18. The bottom and top open container members 12 and 14 respectively, are formed of a static protective material. An electrostatic discharge sensitive electronic component, such as the circuit card 22 containing MOS devices is positioned between the bottom container member 12 and the top container member 14, and when these two container members 12,14 are joined together at their open ends, they form an equi-potential surface which completely envelopes the circuit card 22, as shown in the top container in FIG. 2. Hinges 20 are attached at the rear of each of the container members 12,14 and permit multiple openings and closings of the container members 12,14 in relation to each other as well as providing a mechanism which tightly holds the container members 12,14 together at the contact surface adjacent to the hinges 20 when the container 10 is closed.

Referring again to FIG. 1, an electrostatic discharge sensitive component such as the circuit card 22 is positioned and secured inside the two container members 12,14. As shown, one means of supporting the circuit card 22 is the use of static protective foam liners. The liners in this case have been formed into a convoluted shape for supporting the circuit card 22 at various points.

In accordance with the invention, an aperture is included in the means of support for the electronic component 22. Through this aperture, the presence or absence of container 10 contents may be ascertained. In some cases, labeling or other documents accompanying the circuit card 22 may be missing from the container 10. Where handlers assume that an absence of visible documents indicates an empty container, and the only way to assure a lack of contents is to actually open the container, problems have resulted. Handlers may not take the time to open all containers to verify that they are empty. A normal procedure may be to return all empty containers to a central supply point to await further need. When the container has no visible documents but in fact does contain a circuit card, this circuit card may be returned to the central supply point in the container which is presumed empty. It would not be discovered until the next user opens the container. Valuable components may thus be "lost".

The invention provides a solution to such a problem by including an aperture in the support means inside the container. Where the container is formed of an optically transparent material and the support means has an aperture, the container may be easily inspected for the presence of contents without opening it to verify that it is indeed empty.

As shown in FIG. 1, the support means inside the container 10 comprises opposing sheets of convoluted, static protective foam 24,26. A full sheet 24 is placed in the top container member 14 while two sheets 26 are placed in the bottom container member 12. The two sheets 26 in the bottom container member are narrower than the member 12 so that an opening exists between them. The material which may be used for this foam includes well known partially electrically conductive foams available from a variety of sources (such as an anti-static polyurethane foam) or may be foam impregnated with an electrically conductive material such as where the foam sheets are made of a resin containing carbon or graphite particles. Other techniques may be used which are known in the art.

The description "static protective" is used in a general sense herein and is intended to refer to materials which may provide electrostatic discharge protection. This includes anti-static materials (approximately $10^9$–$10^{14}$ ohms per square), static-dissipative materials (approximately $10^5$–$10^9$ ohms per square) and more conductive materials.

In this embodiment, the foam liners 24,26 are formed with an excessive height so that they are compressed somewhat by the circuit card 22 and provide adequate support. Since they contact both the circuit card 22 and the static protective walls of the respective container member 12,14, they create a continuous electrical path and become part of the equi-potential surface surrounding the circuit card 22. Any electrostatic charge may then be distributed over a much wider area. Also, such a path promotes the discharge of static electricity from the circuit card 22 when the container 10 is brought into contact with ground potential. By forming the foam 24,26 with a height dimension which exceeds that of the respective container member, the circuit card 22 is protected against physical shocks as well as electrostatic discharges. The convolutions 28 on the foam sheets 24,26 will flatten somewhat providing more even support.

Figure 3:
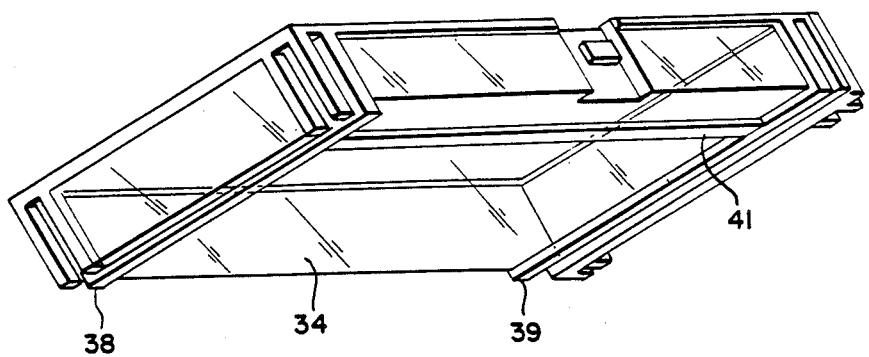
FIG. 3 shows the ridges on the bottom surface of the bottom open-ended container which may be used for stacking purposes.

Also in FIG. 1, it will be seen that the bottom and top container members 12,14 each have two pairs of opposing side walls 30,32 (bottom container member) and 31,33 (top container member). In this embodiment the opposing walls are parallel to each other and are perpendicular to their adjoining walls. Additionally, each container member 12,14 has a closed end 34,36 and an open end opposite the closed end. In the case of the bottom container member 12 closed end 34, its outside surface may have a particular shape such that stacking one container on another or next to another is more easily accomplished. The descriptions of "top" and "bottom" and "front" and "rear" are used herein for convenience of reference and not for limitation. The opening of the pocket is considered the front of the container and the wall of the pocket opposite the opening is considered the rear. As discussed previously, the hinges 20 are attached at the rear of the container 10. In the embodiment shown in FIG. 3, the outside surface 34 includes ridges 38,39 disposed in the front to rear direction of the container 10 and ridge 41 disposed at an intersecting angle to the other ridges and disposed near the front of the container member. These ridges 38,39,41 are used to engage a particularly shaped top surface on another container.

In the case of the third open container member (pocket container member) 16, an engaging surface is provided for use in stacking with the bottom container member 12 of another container. In the embodiment shown in FIG. 1, the engaging surface 40 is a raised surface formed on the pocket container member 16. It will be seen by comparing FIG. 3 with FIG. 1 that the ridges 38,39 of FIG. 3 will slide on the outside of the raised surface 40 of FIG. 1. The ridge 41 disposed near the front will limit movement in the rear direction. When formed in accordance with the above, containers 10 may be accurately stacked in alignment and will not easily slide off of one another in the lateral or rear directions. As used herein, "stacking" is intended to be taken in a general sense to indicate positioning a plurality of containers in contact with one another and may include forming a stack in the vertical direction as well as the horizontal direction or other directions.

As shown in the embodiment of FIG. 1, the container 10 is hinged along one pair of side walls 30,31 at the rear of the container 10 and includes a latching means 42 at the opposite pair of side walls 30,31 at the front of the container 10. In FIG. 1, the latching means 42 is shown as a clip having two openings which are approximately the same size as corresponding protrusions 44,46 on the top container member 14 and the bottom container member 12 respectively. This type of latching arrangement is known in the art and is not described further herein. The specific construction illustrated in the drawings and described herein is intended to only be exemplary in nature and is not intended to be a limitation of the invention. Different latching arrangements may be used, other than that shown in FIG. 1. In some cases, two or more latching devices may be required on the same side. As another example, the top container member 14 and the bottom container member 12 may not be hinged, but may be configured so that they merely fit together and an arrangement is provided to latch them together on two walls, three walls or all four walls. Variations on the exemplary embodiment given herein may occur to those skilled in the art, however it is intended that such variations and modifications are within the scope of the invention.

Figure 4A:
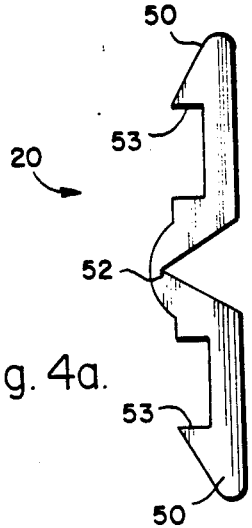
FIGS. 4a and 4b show a plastic hinge usable in a container in accordance with the invention and a bracket formed on the container members, into which the hinge may be inserted.
Figure 4B:
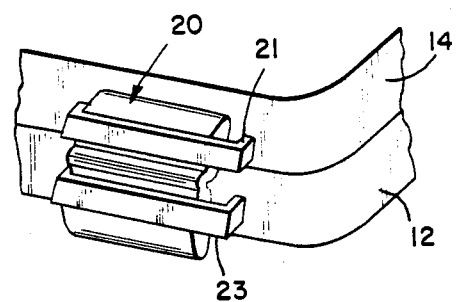

A hinge device which is usable in the container 10 of FIG. 1 is shown in FIG. 4a. This hinge 20 may be formed of a static protective plastic material and snaps into corresponding brackets 21,23 shown in FIG. 4b formed onto both top and bottom container members 12,14. Hinges such as these are usable for relatively long periods and will withstand numerous openings and closings of the container 10. An advantage to using an arrangement such as that shown is that if the hinge 20 should fail, it may be replaced by another. Thus the container members are reusable in spite of broken hinges. As shown in FIG. 4, the hinge includes two "snap-in" protrusions 50 and a center region 52 having a reduced cross section where the actual bending occurs. The protrusions 50 slide into brackets 21,23 in each of the container members and the flat surface 53 of the protrusions prevents the hinge from being dislodged from the container member bracket.

A further feature of the invention is an integral pocket for holding identification material and which enables identification of the container contents without opening or disturbing the top and bottom container members. As used herein "identification material" is meant in a general sense and includes documents accompanying the container contents. These documents may include drawings, reports, bar code graphs, magnetic media, test results, and other materials related to the contents. As shown in FIG. 1, the pocket is formed by attaching the open end of the pocket container member 16 to the outside surface 36 of the closed end of the top container member 14. In this embodiment, the pocket container member 16 extends to the rear of the top container member 14 and snaps into the top container member 14 by means of protrusions, two of which are labeled by the numeral 54. These protrusions may be welded or glued into place in slots 56 in the top container member 14.

As further shown in FIG. 1, the top container member 14 has a ridged top surface 36. In addition to adding strength to this member 14, the back ridge 58 functions as a stop to prevent identification material placed into the pocket from sliding further back on the top container member 14. There are also side ridges 60 which will inhibit identification material from a sidewards motion.

Referring now to FIG. 5, there is shown a corresponding ridge 62 formed on the pocket container member 16. When this ridge 62 is aligned with the ridge 58 of the top container member, a back surface of the pocket is defined which will prevent identification material movement further in the rear direction.

The side walls 64 of the pocket container member 16 have the protrusions 54 for assembly with the top container member 14 as discussed above. As will be seen by reference to FIG. 1, the side walls 64 of the pocket container member 16 may be placed outside of the side ridges 60 of the top container member 14. The combination of the pocket container member 16 side walls 64 and side ridges 60 of the top container member 14 thus also form complete side surfaces which will prohibit sidewards identification material movement in the pocket.

The height of the pocket container member 16 is selected to be large enough to accommodate the necessary identification material accompanying the contained component. In FIG. 1 there is shown only a card 65 having a bar code graph and some other characters which function as identification material. If this were to be the only identification material accompanying any contained component, the height of the pocket container member 16 could be small. However, in many cases, drawings, deficiency reports, and other identification material will accompany the card 65 thus dictating that the height of the pocket container member 16 be increased.

A further feature of the pocket in accordance with the invention is the pocket tab 18. One of the objects of this tab is to provide viewing access to the identifying material of the contained component without necessitating that the container 10 be opened. In the embodiment presented in FIGS. 1, 6a and 6b, the tab 18 comprises a plastic structure having a window 66 through which the identification material may be viewed. The tab 18 is also hinged 68 in this embodiment to permit the insertion into or removal of identification material from the pocket. As shown in FIGS. 6a and 6b, a protrusion 70 is provided with an integral hemisphere 72 for snapping the tab 18 into place onto the top container member 14. The protrusions 70 are inserted into corresponding slots 74 located in the top container member 14 (FIG. 1). Other protrusions 76 are used to permanently assemble the top part of the tab 18 to the pocket container member 16. These other protrusions 76 are similar to those 54 on the pocket enclosure 16 in that they are meant to unite the parts in a more permanent joint, whereas the protrusions 70 on the tab 18 are meant to be opened and closed numerous times to allow the insertion or removal of identification material. The protrusions for permanent joints may be welded or glued in place or held by other means known in the art.

Figure 2:
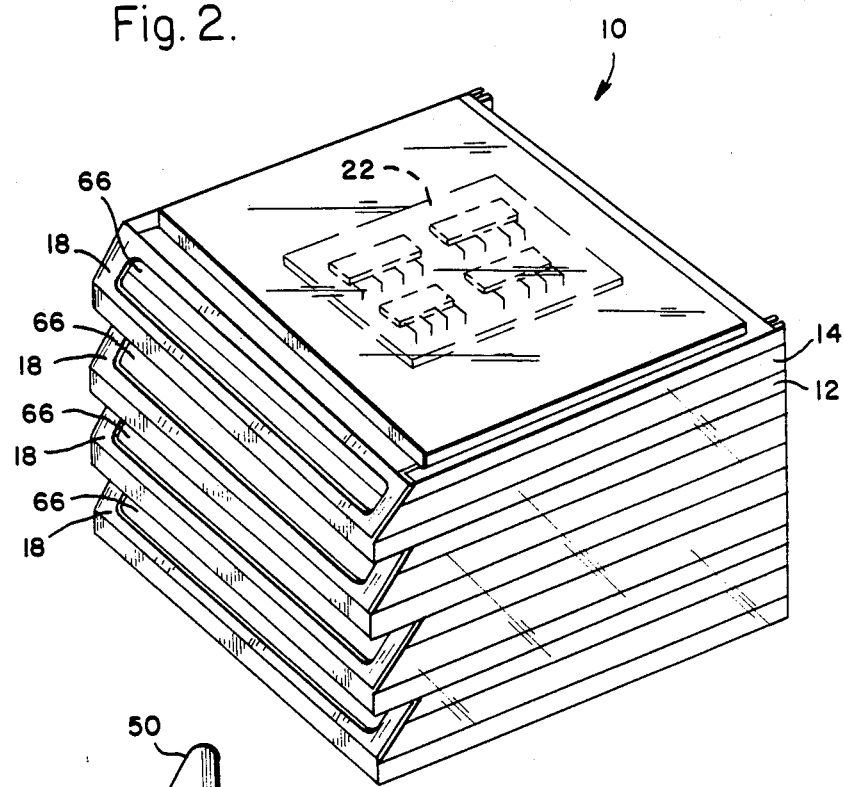
FIG. 2 is a perspective view of a stack of containers in accordance with the invention. In the top container, the circuit card shown in FIG. 1 is shown in phantom lines.

As shown in FIGS. 1, 6a, and 6b, the angle of the tab 18 is approximately 45 degrees. While this angle may vary, it has been found that a 45 degree angle results in easy access to the tab 18 window 66 both in vertical and horizontal stacks. In FIG. 2 a stack of containers in accordance with the invention is shown. The tab 18 windows 66 are at a 45 degree angle and a viewer can inspect the identification material through those windows. Whether the identification material comprises a bar code graph readable by a light sensor or LASER, or a magnetic strip readable by a sensor, or a number and description readable visually, the invention facilitates the identifying procedure. The identification material can be easily read without removing the container from the stack. Also, if it is desired to insert or remove identification material from the pocket, this may be accomplished without removing the container 10 from the stack.

In a container made in accordance with FIG. 1, a bar code graph such as that shown on the card 65 may be placed such that it is visible through the window 66 of the tab 18. The card 65 would be folded as shown and will not move in the pocket if it is relatively rigid and is very near the same size as the pocket. In one embodiment, the window 66 is an opening in the tab 18. However, where a LASER bar code graph reader is used, the window may be covered with an optically transparent material. The card, such as that indicated by numeral 65 in FIG. 1 may be computer generated and printed. Although the window 66 is used for ready access to identification material such as the card 65 having a bar code graph, the pocket may function to hold other identification material as well, as described above.

Figure 7:
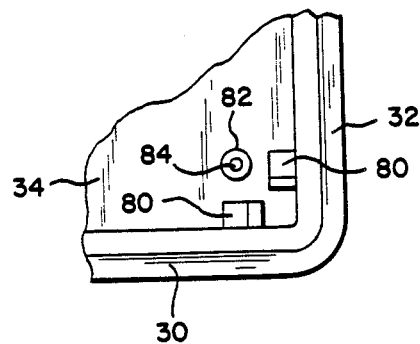
FIG. 7 presents another embodiment of mounting means for positioning and securing the contents inside the container.

Although convoluted foam is shown in FIG. 1 as a means to secure the component, other techniques are usable provided that they permit viewing of the component through at least one of the container members. For example, in FIG. 7, a mounting technique is shown where the protrusions 80 from the side 30,32 walls are used to secure the components in the horizontal plane. The protrusion 82 from the inside surface 34 of the bottom container member 12 is circular in cross section and may include a reduced cross-sectional size part which may fit into a hole in the circuit card. If the top container member 14 includes a protrusion extending into the container from its inside surface, and the protrusion is aligned with the protrusion 82 shown in FIG. 7 from the bottom container member, the contained component will be secured in the vertical plane also. Other techniques are usable as well as combinations of the techniques described. Foam liners may or may not be used in this instance.

As used herein, "component" or "electronic component" is not meant in a restrictive sense but is intended to refer to a wide variety of articles which are electrostatic discharge sensitive. Thus the terms are meant to include the circuit card assembly shown in FIGS. 1 and 2, or integrated circuit chips alone, or smaller or larger devices or assemblies of devices. The size of the container 10 may be selected as appropriate.

A feature of the invention is the formation of the top and bottom container members 14, 12 of an integrally static-protective material rather than coating a material. It has been found that a static dissipative plastic such as that distributed by Olympic Plastics, Inc., 5800 West Jefferson Boulevard, Los Angeles, Calif. 90016, under the name BENSTAT yields good results. This material is rugged, optically transparent, and has surface resistivity properties between $10^8$ to $10^{10}$ ohms per square. The bottom, top, and pocket container members 12,14,16 are made of this plastic while the other items, such as the hinges 20, tab 18, and latch 42 may be made of a softer, more flexible material. While some advantage may be gained if they were also made of a static protective material, these items need not be optically transparent and other, less expensive materials such as polypropylene may be used. The pocket container member 16 is formed of this optically transparent material so that the identification material may be read from outside the container. Where the container is to be used for military purposes, there may be a requirement that all parts must be formed of a static protective material. In this case, BENSTAT may be used for all these items. The parts may be formed by such well known techniques as injection molding or vacuum forming.

Thus there has been illustrated and described an improved protective container having an internal pocket which facilitates the identification of the contents. Identification material may be inserted or removed from the pocket conveniently and without disturbing the equipotential surface established by the top and bottom container members. This is an advantage over prior techniques where labels were glued to a side of the container and had to be removed and a new one reglued in its place when necessary. In the invention, the identification material may simply be removed from the pocket and a new one inserted. The invention also includes the feature of a means for verifying the existence of any contents. Due to the structure and parts of a container made in accordance with the invention, the contents are well protected from damaging electrostatic discharges and from physical shocks. Contents that may accumulate charges are protected by the provision of an electrical path which provides a means for the dissipation of any such accumulated charge.

While a particular embodiment of the invention has been presented, various changes and modifications may be apparent to those skilled in the art which do not depart from the scope of the invention. An object of the claims is to encompass such changes and modifications as fall within the scope of the invention.

What is claimed:

1. A container for shielding electronic components from electrostatic discharges, the container having an integral pocket for holding identification material, comprising:

first and second container members each of which is formed of a static protective material and is open at one end and closed at the opposite end, and having inside and outside surfaces, the members being shaped so that they may be joined together at their open ends to form a closed container, at least one of the first and second container members having a ridged top surface;

means for securing an electronic component in a predetermined position within the first and second container members;

a pocket container member interfacing the ridged top surface, the pocket container member having a peripheral edge and open at one end and closed at the opposite end and having inside and outside surfaces and having a side in which an opening is formed through which may be inserted and removed the identification material, the pocket container member further having a raised surface for the stacking of another container thereon, the raised surface being disposed on the outside surface of the closed end of the pocket container member, the pocket container member also having a plurality of protrusions that engage either the first or the second container member;

wherein the pocket container member is engaged with the outside surface of the closed end of one of the other container members to form a pocket therebetween; and a tab covering the opening of the pocket to hold the inserted identification material within the pocket, the tab having a window through which the identification material may be viewed, the tab being moveable relative to the pocket container member.

2. The container of claim 1 wherein the pocket container member includes a plurality of side walls and an inside ridge intermediate the side walls and positioned in relation to the opening and having a height selected so that movement of the identification material inserted into the pocket is limited.

3. The container of claim 1 wherein the tab is hinged for movement to an open position for inserting and removing the identification material and for movement to a closed position for holding the identification material within the pocket.

4. The container of claim 1 wherein the window is disposed substantially at a 45 degree angle to the opening.

5. The container of claim 1 wherein:
   the first and second container members are formed of an optically transparent material; and
   the first means comprises static protective foam having an aperture through which the electronic component may be viewed from outside the container, the foam being in electrical contact with the electronic component and with the first and second container members forming an electrical path thereby.

6. The container of claim 1 further comprising stacking means for engaging the outside surface of another container stacked therewith for limiting movement of the containers in relation to one another.

7. The container of claim 6 wherein the stacking means is further for limiting lateral movement and movement in the rear direction but allows movement in the front direction.

8. The container of claim 7 wherein the stacking means comprises
   ridges disposed on the outside surface of the closed end of the container member opposite the pocket container member;
   wherein the raised surface and ridges are shaped and positioned for engaging other containers for limiting relative movement.

9. The container of claim 8 wherein the ridges are disposed parallel to one another and are disposed in a front to rear direction in relation to the container.

10. The container of claim 1 further comprising:
    hinge means for allowing hinged movement of the first and second container members between closed and open positions in relation to each other; and
    latch means for holding the first and second container members in substantially fixed positions relative to one another.

11. The container of claim 10 wherein:
    the first and second container members each comprise a pair of opposing sides;
    the hinge means comprises a hinge attached to one of the sides of both the first and second container members; and
    the latch means comprises protrusions disposed on the opposing sides from the hinge and further comprising a latch which engages the protrusions for holding the first and second container members in the fixed positions.

12. A container for shielding electronic components from electrostatic discharges, the container having an integral pocket for holding identification material, comprising:
    first and second container members each of which is formed of an optically transparent, static protective plastic material and is open at one end and closed at the opposite end and having inside and outside surfaces, the members being shaped so that they may be joined together in electrical contact at their open ends to form a closed container, at least one of the first and second container members having a ridged top surface and at least one side ridge;
    static protective foam disposed inside the first and second container members and in contact with the electronic component so that the electronic component is secured in a predetermined position within the first and second container members, the foam having an aperture through which the electronic component may be viewed from outside the container, the foam further being in electrical contact with the electronic component and with the first and second container members forming an electrical path thereby;

a pocket container member interfacing the ridged top surface, the pocket container member having a peripheral edge and open at one end and closed at the opposite end and having inside and outside surfaces and having a side in which an opening is formed through which may be inserted and removed the identification material, the pocket container member further having a raised surface that can engage a plurality of ridges of another container stacked thereon, the raised surface being disposed on the outside surface of the closed end of the pocket container member, the pocket container member also having a plurality of protrusions that reversibly engage either the first or the second container member;

wherein the inside surface of the pocket container member interfaces the ridged top surface and the side ridge, and the pocket container member is engaged with the outside surface of the closed end of one of the other container members to form a pocket therebetween, and wherein the pocket container member includes an inside ridge positioned in relation to the opening and having a height selected so that movement of the identification material inserted into the pocket is limited; and a tab covering the opening of the pocket to hold the inserted identification material within the pocket, the tab having a window through which the identification material may be viewed, the tab being moveable relative to the pocket container member.

13. The container of claim 12 wherein the tab is hinged for movement to an open position for inserting and removing the identification material and for movement to a closed position for holding the identification material within the pocket.

14. The container of claim 12 wherein the window is disposed substantially at a 45 degree angle to the opening.

15. The container of claim 12 further comprising stacking means for engaging the outside surface of another container stacked therewith for limiting movement of the containers in relation to one another.

16. The container of claim 15 wherein
the raised surface is disposed on the outside surface of the closed end of the pocket container member; and
a plurality of side ridges are disposed on the outside surface of the closed end of the container member opposite the pocket container member;
wherein the raised surface and the side ridges are shaped and positioned for engaging other containers for limiting relative movement.

17. The container of claim 16 wherein:
the side ridges comprise three side ridges, two of which are disposed parallel to each other and in a front to rear direction in relation to the container for limiting relative lateral motion; and
the third side ridge is disposed at an intersecting angle to the other ridges and is disposed near the front of the container for limiting relative movement in a rear direction.

18. An improved stackable container for shielding electronic components from electrostatic discharges and for enabling the reading of identification materials therein while the container is stacked, comprising:

a first container member formed of an optically transparent, static protective material, the first container member having at least one side ridge and a ridged top surface adjacent thereto, the ridged top surface configured and dimensioned to receive the identification materials, the first container member further having a side wall in an angulated position relative to the ridged top surface and capable of supporting at least a portion of the identification materials;

a pocket container member having an outside surface and a raised surface therein that can operatively interface another container stacked therewith, the pocket container member further having a plurality of side walls, an inside ridge intermediate the side walls and operatively engaging the first container member, and a first means for reversibly attaching the pocket container member to the first container member, the reversibly attaching means being fixed to the side walls of the pocket member;

a tab positioned adjacent the angulated side wall of the first container member and capable of being fixed to the first container member and the pocket container member, the tab being configured to describe a window therein and through which the identification materials may be viewed while the container is stacked with another container;

a second means for reversibly attaching the tab to the first container member and the pocket container member;

a second container member formed of an optically transparent, static protective material, the second container member having a plurality of intersecting ridges configured and dimensioned to engage a raised surface of another container stacked therewith, the second container member positioned on a side of the first container member opposite the pocket container member;

a third means for reversibly attaching the second container member with the first container member; and a fourth means for positioning the electronic component intermediate the first container member and the second container member while providing an electrical path between the first and second container members and the electronic component.

19. The invention of claim 18 wherein the first container member has three side ridges.

20. The invention of claim 19 wherein the ridged top surface has a peripheral edge and the side ridges extend along the peripheral edge.

21. The invention of claim 18 wherein the pocket container member describes a portion of a pocket.

22. The invention of claim 21 wherein the first container member describes another portion of the pocket.

23. An improved stackable container for shielding electronic components from electrostatic discharges, and for the reading and the changing of identification materials without the necessity of opening the container, comprising:

a first container member formed of an optically transparent, static protective material having a back ridge, at least one side ridge adjacent the back ridge, the back ridge and the side ridge capable of supporting the identification materials, a ridged top surface interfacing the back ridge and the side ridge, a side wall in an angulated position relative to the ridged top surface, the side wall capable of supporting a portion of the identification materials, and the first container member further describing a plurality of slots;

a pocket container member describing a portion of a pocket that interfaces the ridged top surface, the portion of the pocket defined by an inside surface, a plurality of side walls, and an inside ridge intermediate the side walls, the pocket container member further having a plurality of protrusions fixed to a side wall, and a raised surface opposite the inside surface that can interface another container stacked therewith;

a tab interfacing the pocket and the angulated side wall of the first container member and rotatably fixed relative to the first container member and the pocket container member, the tab being configured to describe a window therein and through which identification materials may be viewed while the container is stacked with another container;

a first means for reversibly attaching the tab to the first container member and the pocket container member;

a second container member formed of an optically transparent, static protective material, the second container member having a plurality of intersecting ridges configured and dimensioned to engage a raised surface of another container stacked therewith, the second container member positioned on a side of the first container member opposite the pocket container member;

a second means for reversibly attaching the second container member to the first container member;

a static protective foam for positioning the electronic component intermediate the first container member and the second container member while providing an electrical path between the first and second container members and the electronic component, the foam being configured to enable viewing of the electronic component from the outside of the container.

24. The invention of claim 23 wherein the first container member describes another portion of the pocket.

25. The invention of claim 24 wherein the slots of the first container member are positioned opposite the protrusions of the pocket container member.

26. The invention of claim 25 wherein the first attaching means includes a plurality of protrusions and integral hemispheres fixed to the tab.

27. The invention of claim 26 wherein the second attaching means includes means for hinging the frist container member with the second container member and means for latching the first container member with the second container member.

28. The invention of claim 27 wherein the latching means is fixed to the angulated side wall of the first container member.

* * * * *